(12) United States Patent
Gao

(10) Patent No.: US 11,785,750 B2
(45) Date of Patent: Oct. 10, 2023

(54) TWO-PHASE COOLANT DISTRIBUTION ARCHITECTURE

(71) Applicant: BAIDU USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 170 days.

(21) Appl. No.: 17/360,036

(22) Filed: Jun. 28, 2021

(65) Prior Publication Data

US 2022/0418169 A1    Dec. 29, 2022

(51) Int. Cl.
*H05K 7/20*    (2006.01)

(52) U.S. Cl.
CPC ......... *H05K 7/20836* (2013.01); *H05K 7/203* (2013.01); *H05K 7/20318* (2013.01); *H05K 7/20327* (2013.01); *H05K 7/20818* (2013.01)

(58) Field of Classification Search
CPC .............. H05K 7/203; H05K 7/20381; H05K 7/20327; H05K 7/20318; H05K 7/2099; F25B 25/005; F25B 23/006; F25B 2339/047; F25B 2313/003; F28D 15/06; F24F 11/84
See application file for complete search history.

(56) References Cited

U.S. PATENT DOCUMENTS

| 8,322,154 | B2 * | 12/2012 | Campbell | F28D 15/0266 62/200 |
|---|---|---|---|---|
| 10,231,357 | B2 * | 3/2019 | Chainer | H05K 7/20354 |
| 10,966,349 | B1 * | 3/2021 | Lau | H05K 7/20281 |
| 2013/0291575 | A1 * | 11/2013 | Ito | F25B 49/00 62/119 |
| 2022/0225527 | A1 * | 7/2022 | Chen | H05K 7/20318 |
| 2022/0418149 | A1 * | 12/2022 | Gao | H05K 7/208 |

* cited by examiner

*Primary Examiner* — Christopher R Zerphey
(74) *Attorney, Agent, or Firm* — WOMBLE BOND DICKINSON (US) LLP

(57) ABSTRACT

In one embodiment, an immersion cooling system comprising one or more electronic devices submerged in a two-phase liquid coolant, a first cooling loop to provide cooling liquid to the immersion system, wherein the first cooling loop comprises a first condenser unit, a first liquid supply line, and a first vapor return line, and a second cooling loop to provide cooling liquid to the immersion system, wherein the second cooling loop comprises a second condenser unit, a second liquid supply line, and a second vapor return line. The apparatus further includes a first pressure sensor coupled to the first vapor return line, a second pressure sensor coupled to the second vapor return line and at least one main cooling source comprising a fluid control valve controlled based on the first pressure sensor and the second pressure sensor.

20 Claims, 6 Drawing Sheets

TWO-PHASE COOLANT DISTRIBUTION ARCHITECTURE

FIELD OF THE DISCLOSURE

Embodiments of the present invention relate generally to data centers. More particularly, embodiments of the invention relate to a two-phase coolant distribution architecture.

BACKGROUND

Thermal management of a data center that includes several active electronic racks is critical to ensure proper performance of servers and other IT equipment operating in the racks. Without proper thermal management the thermal environment within the racks may exceed operational thresholds, resulting in operational consequences (e.g., servers failing, etc.). One way to manage the thermal environment is the use of cooling air to cool the IT equipment. A majority of existing data centers are air cooled. Recently, data centers have been deploying more high-power density electronic racks, where more high density chips are packaged closer together to provide more processing power. Cooling these high-density racks by maintaining a proper thermal environment may be an challenge with existing cooling systems, especially within the constant increasing power density of the racks.

Existing solutions for cooling systems include phase changes systems. Such systems, however, may not include redundant design or may not provide full redundancy of the overall cooling system, which means a single failure port is included. Additionally, the existing solutions may require significant amount of tuning and control even after the solution has been deployed.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
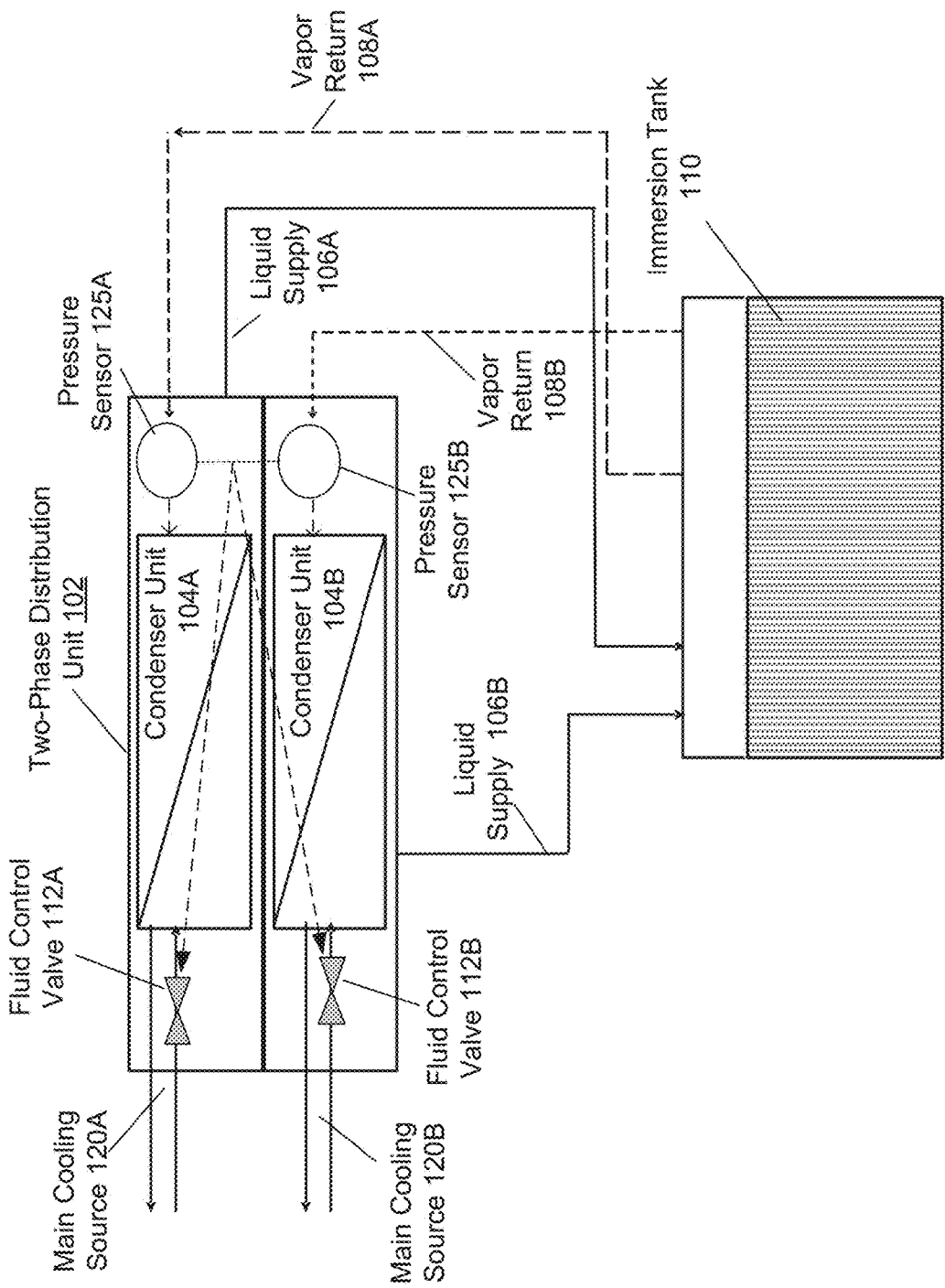
FIG. 1 is a system diagram illustrating a cooling design with a redundant main two-phase cooling source and a redundant two-phase cooling system, according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the present disclosure provide an advanced phase change distribution system with full redundancy for different systems with internal control to accommodate different operational scenarios. The cooling architecture of the phase change distribution system may be implemented for electronics racks and clusters. The cooling architecture can include immersion tank based computing clusters. The cooling architecture may include a core unit including at least two condensing core units arranged in parallel with each other. For example, the two condensing core units may be included within a two-phase distribution unit. The two-phase distribution unit can distribute the liquid in two parallel loops to the load (e.g., an immersion cooling system) and return the vapor in parallel from the load. Two pressure sensors can be included on the vapor return loops, one pressure sensor on each vapor return loop. The pressure sensors may control one or more main cooling sources to the core condenser units. Accordingly, the pressure sensors may control the main cooling sources to ensure the cooling capacity is sufficiently delivered to the two phase distribution unit. In one embodiment, the internal system design within the two phase distribution unit may enable the cooling source to be unevenly distributed to the condensing cores based on the readings of the pressure sensors.

Embodiments of the present disclosure may thus enable advanced thermal management for data centers and servers. Embodiments may accommodate different system levels and cluster level architectures. Additional advantages of the present disclosure include high system reliability, increased power efficiency, and compatibility with different systems and facility infrastructure.

According to one embodiment, an immersion cooling system includes an immersion tank to contain one or more electronic devices that are at least partially submerged in a dielectric coolant contained therein, a first cooling loop to provide cooling liquid to the immersion tank, wherein the first cooling loop comprises a first condenser unit, a first liquid supply line, and a first vapor return line, and a second cooling loop to provide cooling liquid to the immersion tank, wherein the second cooling loop comprises a second condenser unit, a second liquid supply line, and a second vapor return line. In one embodiment, the system further includes a first pressure sensor coupled to the first vapor return line, a second pressure sensor coupled to the second vapor return line and at least one main cooling source comprising a fluid control valve controlled based on the first pressure sensor and the second pressure sensor.

In one embodiment, the at least one main cooling source includes a first main cooling source coupled to the first condenser unit and a second main cooling source coupled to the second condenser unit. In one example, the first main cooling source includes a first fluid control valve and the second main cooling source comprises a second fluid control valve. In one embodiment, the first fluid control valve is controlled at least in part by the second pressure sensor and the second fluid control valve is controlled at least in part by the first pressure sensor. In one embodiment, the first main cooling source comprises a two-way fluid control valve to the first condenser unit and to the second condenser unit. In one embodiment, the at least one main cooling source comprises one main cooling source comprising a splitter fluid control valve to the first condenser unit and the second condenser unit.

In one embodiment, the first condenser unit, the second condenser unit and the at least one fluid control valve are included within a two-phase distribution unit. In one embodiment, the first pressure sensor and the second pressure sensor are disposed within the two-phase distribution unit. In one embodiment, the apparatus further includes a management controller to receive pressure data from the first pressure sensor and the second sensor and control the at least one fluid control valve based on the pressure data from the first pressure sensor and the second pressure sensor.

FIG. 1 shows a system design with a redundant main two-phase cooling source and a redundant two-phase cooling system, according to one embodiment. The two phase distribution unit 102 may be the core of the disclosed system architecture 100. The two-phase distribution unit may include two core systems each of which may include a main cooling loop, a condenser core, phase change loops, and a sensor. The load, as depicted, may be a two-phase based immersion cooling server container. However, the load may be any two-phase cooling system.

In one example, the two phase loops are operated in similar, or identical, modes if the vapor is distributed equally in parallel to the two loops. The pressure sensors may be included within the distribution unit and used for sensing the pressure of the vapor in the vapor return loops. The pressure sensors can be used to control the individual valves in the main cooling source, thus controlling the cooling fluid flowrate to the condenser. In particular, in one embodiment, the first pressure sensor of the first loop may be used for controlling the second control valve to the first condenser unit and the second pressure sensor of the second loop may be used for controlling the first control valve to the first condenser unit. In another embodiment, both pressure sensors may be used together to control the two control valves to the condenser units. For example, if the pressure at the second pressure sensor is high there may be a high heat load on the second cooling loop, or there may be a failure of the second cooling loop. The control strategy for different scenarios may vary depending on the pressure measurements of the pressure sensors in each scenario.

In one embodiment, referring to FIG. 1, the cooling system 100 includes a two phase distribution unit 102. In one example, the two phase distribution unit 102 includes two condenser units 104A-B, each coupled to a liquid supply and vapor return loop for providing liquid cooling to electronics. For example, condenser unit 104A may be coupled to liquid supply line 106A to provide cooling liquid to immersion tank 110. The immersion system 110 can be a tank filled with a cooling liquid (e.g., filled via the liquid supply lines 106A-B) in which one or more servers or other electronic devices are immersed for cooling. The heat generated during operation of the servers may be extracted by evaporation of the cooling liquid. The evaporated cooling liquid, otherwise referred to as vapor, may then travel back to the condenser units 104A-B via vapor return lines 108A-B.

Condenser unit 104A may further be coupled to vapor return line 108A for returning vapor (e.g., evaporated cooling liquid) from the immersion tank to condenser unit 104A. Condenser unit 104A may receive a cooling liquid from a main cooling source 120A (e.g., via a primary cooling loop) that the condenser unit may use to cool and condense the vapor returned via vapor return 108A. Similarly, condenser unit 104B may be coupled to a liquid supply line 106B, a vapor return line 108B and a main cooling source 120B each with similar functionality to liquid supply line 106A, vapor return line 108A, and main cooling source 120A, respectively.

According to some embodiments, a first pressure sensor 125A may be coupled to the vapor return line 108A and a second pressure sensor 125B may be coupled to the vapor return line 108B. In one example, the first pressure sensor 125A continuously or periodically measures the vapor pressure in the vapor return line 108A. Similarly, the second pressure sensor 125B continuously or periodically measures the vapor pressure in vapor return line 108B. Because the evaporation of the liquid in the immersion tank may be unevenly distributed and the vapor is thus unevenly distributed, the amount of vapor, and accordingly the vapor pressure, in vapor return line 108A and 108B may vary from one another and may vary over time. Thus, the heat load on condenser unit 104A and 104B may also vary. For example, condenser unit 104A may have a larger heat load than condenser unit 104B.

Therefore, based on the pressure measured by the pressure sensors 125A-B, the fluid control valves 112A-B may be controlled to increase or decrease the cooling capacity of the corresponding condenser unit 104A-B. In one example, the pressure measured by pressure sensor 125A may be used to control the fluid control valve 112B and the pressure measured by pressure sensor 125B may be used to control the fluid control valve 112A. As depicted in FIG. 1, the measurement data from the two pressure sensors 125A and 125B may be converged and used together for controlling the fluid valves 112A and 112B.

In one example, because the two pressures measured by pressure sensors 125A-B represent the heat load delivered to each of the condenser units 104A-B, the values of the pressures measure may be used to adjust the amount of cooling fluid delivered to each of the condenser units 104A-B. In one embodiment, a micro controller may be included in the two phase distribution unit 104 for receiving and processing pressure sensor data, to control the fluid control valves 112A-B and to manage the main cooling sources. In addition, the corresponding relationship between the valve open ratio and cooling fluid flowrate may be pre-characterized and tuned so that the valve can be adjusted to a certain open ratio based on the corresponding readings of the two pressure sensors 125A-B. In one example, the two pressure sensors 125A-B may be used because the power within the systems can be dynamic, therefore, the vapor amount may be different in the two vapor return loops 108A-B. In another scenario, the main cooling sources 120A-B may be controlled dynamically. For example, senser data from pressure sensors 125A-B is collected and analyzed for a period of time. Thus, the variation in behavior can be used for identifying the proper control strategies for the two-phase distribution unit 102.

In one example, a high pressure measured by one of the pressure sensors 125A-B means higher vapor and a higher heat load. A higher heat load may indicate that more cooling fluid may need to be provided to the corresponding condenser. In another example (e.g., in a failure scenario), dynamic monitoring be used. For example, if condenser unit 104B fails, then the pressure sensor 125B reading may continually increase. However, in such a failure scenario, increasing the cooling flow rate to the condenser unit 104B may not the right solution because the condenser unit 104B has already failed. Therefore, in this scenario, when a dynamic increasing feature is captured, then cooing fluid provided by main cooling source 120A should be increased significantly to increase cooling capacity of condenser unit 104A to compensate for the failed condenser unit 104B.

Figure 2:
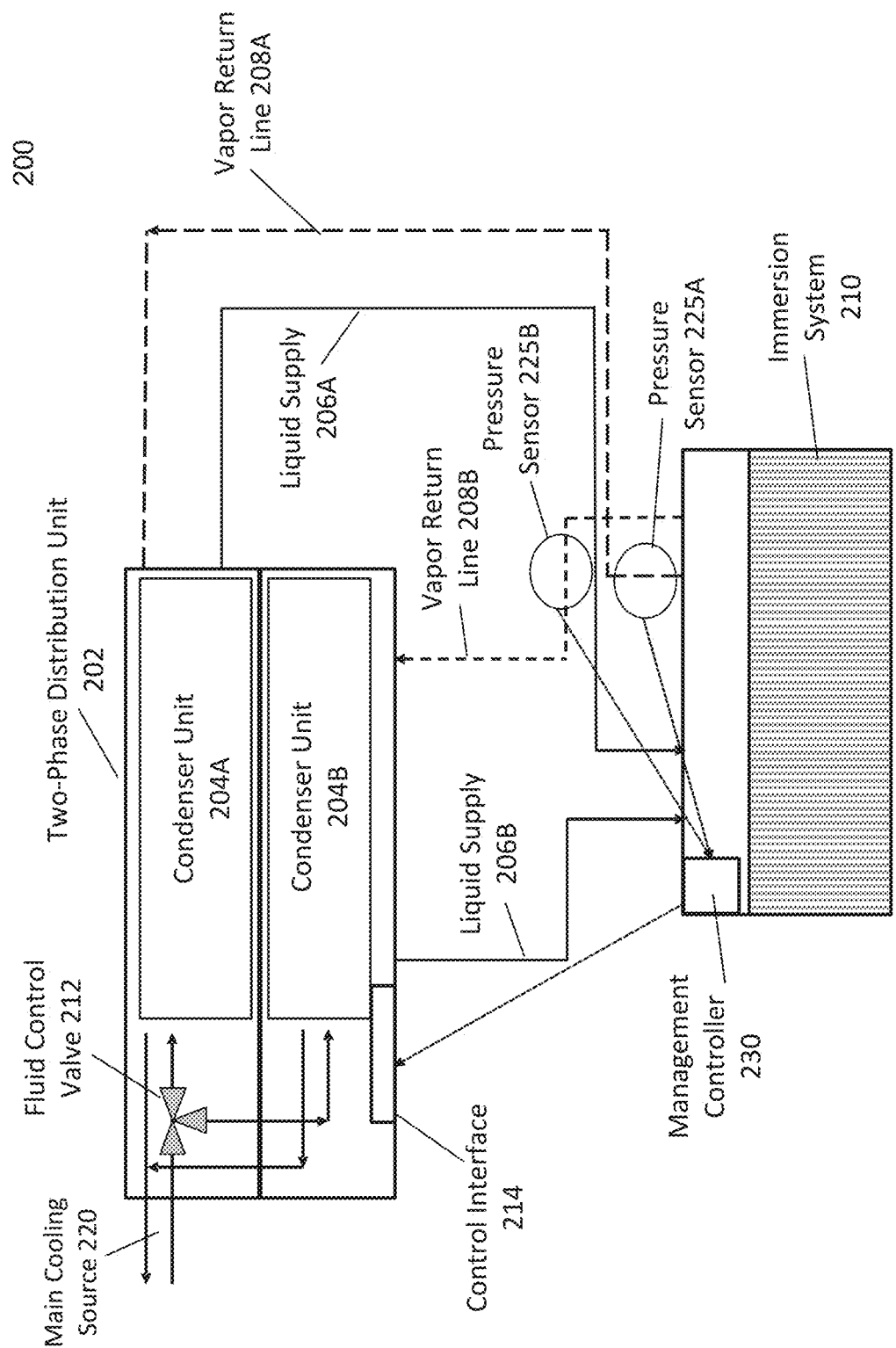
FIG. 2 is a system diagram illustrating a cooling design including pressure sensors packages on the vapor return loops outside of the distribution unit, according to one embodiment.

FIG. 2 shows a system design including pressure sensors packages on the vapor return loops outside of the distribution unit. The pressure sensors may be coupled to the vapor return loops between the immersion system and the distribution unit or within the immersion system. Additionally, the immersion system may include a management controller for communication with the distribution unit (e.g., through TCP/IP) for controlling the main cooling source based on the measurements of the pressure sensors. It should be noted that although there are multiple loops, only one loop may be controlled for different scenarios.

In one embodiment, referring to FIG. 2, the cooling system 200 may include a two-phase distribution unit 202, which may be the same or similar to two-phase distribution unit 102. The two-phase distribution unit 202 may include two condenser units 204A-B, which may be the same or similar to condenser units 104A-B. Similar to system 100 of FIG. 1, cooling system 200 includes a liquid supply 206A-B and a vapor return 208A-B for each condenser to provide cooling liquid to and receive vapor from the immersion system 210. Immersion system 210 may be the same or similar to immersion system 110, as described with respect to FIG. 1.

In one embodiment, a first pressure sensor 225A may be coupled to the vapor return line 208A and a second pressure sensor 225B may be coupled to vapor return line 208B. As depicted in FIG. 2, the pressure sensors 225A-B may be coupled to the vapor return lines 208A-B external to the two phase distribution unit 202. Similar to FIG. 1, pressure sensors 225A-B may be used to control a main cooling source to the condensers 204A-B via fluid control valve 212. In one example, a single fluid control valve 212 may control the main cooling source to each of the condensers 204A-B.

In one embodiment, system 200 may include a management controller 230 in communication with the pressure sensors 225A-B. The management controller 230 may receive pressure measurements from the pressure sensors 225A-B and provide control signals to the fluid control valve 212 via a control interface 214 coupled to the fluid control valve 212.

Figure 3:
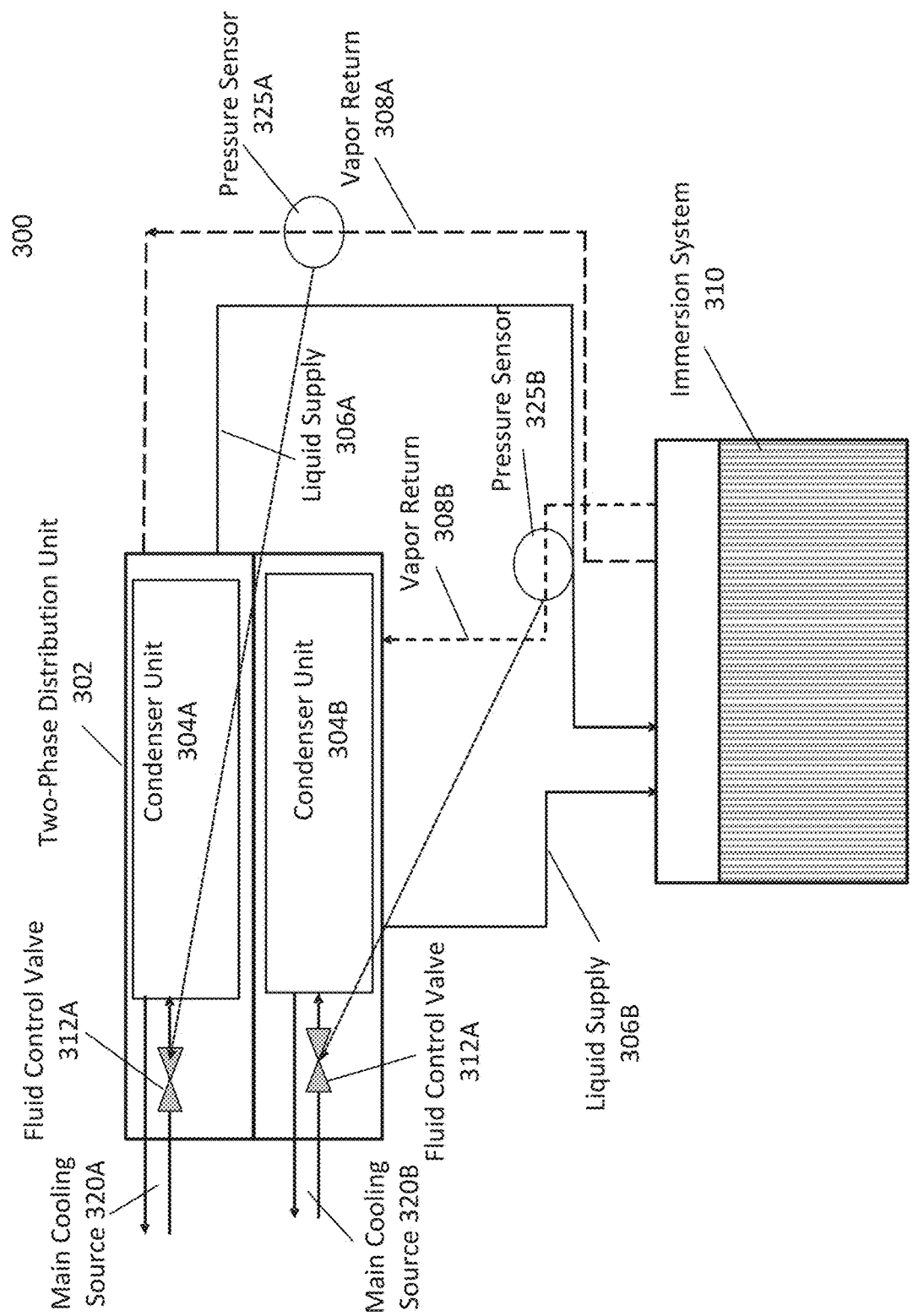
FIG. 3 is a system diagram of another redundant two-phase cooling design in which the two-phase distribution unit includes a parallel main cooling source input and each condensing core is equipped with fluid systems, according to one embodiment.

FIG. 3 shows another redundant two-phase cooling design in which the two-phase distribution unit includes a parallel main cooling source input and each condensing core is equipped with fluid systems. The pressure sensors are packaged outside the distribution unit on the vapor return lines. In this design, the pressure sensors are added on the loops which may simplify the design of the two-phase distribution unit 302 and segregate the sensors from the two-phase distribution unit 302. This may be used in the cases that a large scale two phase distribution unit is used for multiple immersion systems 310. Immersion system 310 may be the same or similar to immersion system 110, as described with respect to FIG. 1.

In one embodiment, referring to FIG. 3, a cooling system 300 may include a two-phase distribution unit 302, which may be similar to two-phase distribution unit 102 and 202. Similar to system 100 of FIG. 1, system 300 includes two condenser units 304A-B and a liquid supply 306A-B and a vapor return 308A-B for each condenser unit 304A-B to provide cooling liquid to and receive vapor from the immersion system 320. Additionally, system 300 includes a fluid control valve 312A-B associated with each condenser unit 304A-B. System 300 may further include a pressure sensor 325A on vapor return line 308A and a pressure sensor on vapor return line 308B. As depicted, pressure sensor 325A may communicate with and control fluid control valve 312A while pressure sensor 325B may communicate with and control fluid control valve 312B.

Figure 4:
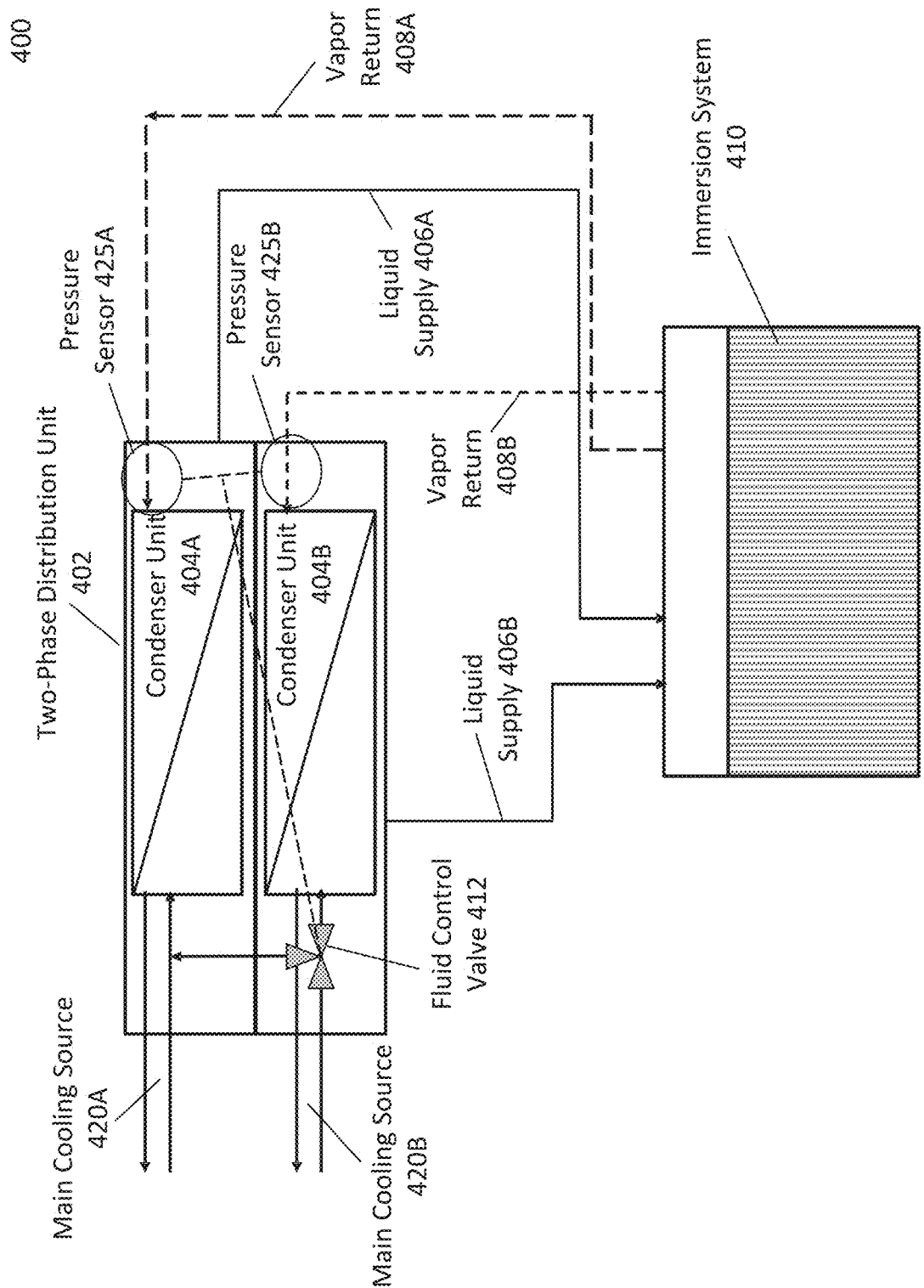
FIG. 4 shows a two-phase distribution unit including a single valve and internal design to enable advanced fluid management on the main cooling source, according to another embodiment.

FIG. 4 shows a two-phase distribution unit including a single valve and internal design to enable advanced fluid management on the main cooling source. In this design, the two separate main cooling sources can be merged into one single condensing core for certain scenarios.

In one embodiment, referring to FIG. 4, a cooling system 400 may include a two-phase distribution unit 402, which may be similar to two-phase distribution unit 102, 202, and 302. Similar to system 200 of FIG. 2, system 400 includes two condenser units 404A-B and a liquid supply 406A-B and a vapor return 408A-B for each condenser unit 404A-B to provide cooling liquid to and receive vapor from the immersion system 410 and a single fluid control valve 412 associated to control a main cooling source to both condenser units 404A-B. Immersion system 410 may be the same or similar to immersion system 110, as described with respect to FIG. 1. System 400 may further include a pressure sensor 425A on vapor return line 408A and a pressure sensor on vapor return line 408B. As depicted, pressure sensors 425A-B may be packaged within the two-phase distribution unit 402. Thus, the entire functionality of monitoring vapor return line pressures and controlling the main cooling source via a valve may be packaged entirely within the two-phase distribution unit.

Figure 5:
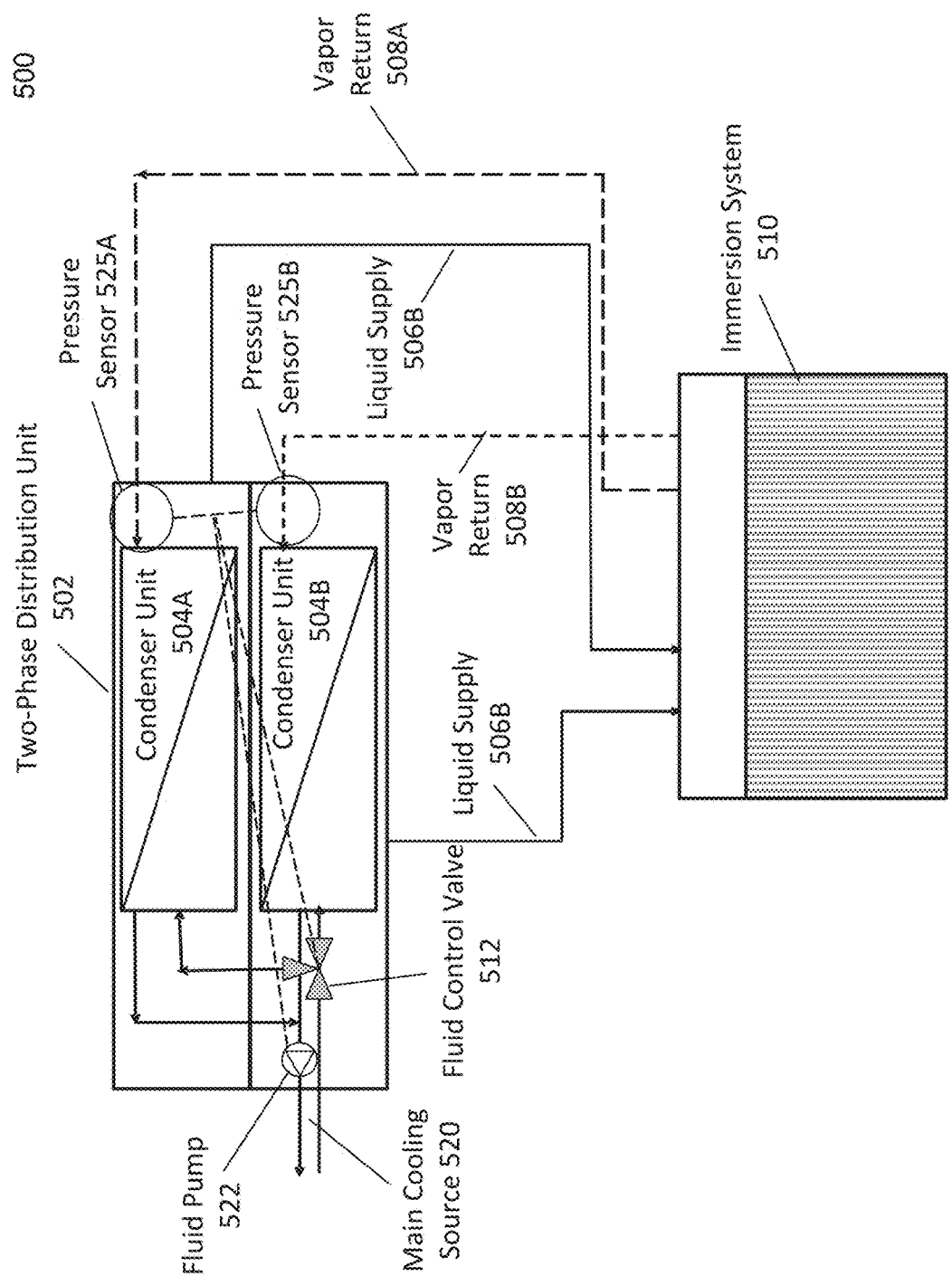
FIG. 5 shows an advanced system design of a two-phase distribution unit including additional features, according to another embodiment.

FIG. 5 shows an advanced system design of a two-phase distribution unit including additional features. The main cooling source return loops may include a pump which may also be controlled by the internal pressure sensors on the vapor return lines.

In one embodiment, referring to FIG. 5, a cooling system 500 may include a two-phase distribution unit 502, which may be similar to two-phase distribution unit 102, 202, 302, and 402. Similar to system 200 of FIG. 2, system 500 includes two condenser units 504A-B and a liquid supply 506A-B and a vapor return 508A-B for each condenser unit 504A-B to provide cooling liquid to and receive vapor from the immersion system 510 and a single fluid control valve 512 associated to control a main cooling source to both condenser units 504A-B. Immersion system 510 may be the same or similar to immersion system 110, as described with respect to FIG. 1. System 500 may further include a pressure sensor 525A on vapor return line 508A and a pressure sensor 525B on vapor return line 508B. As depicted, pressure sensors 525A-B may be packaged within the two-phase distribution unit 502. Additionally, system 500 may include a fluid pump 522 on the return of the main cooling source 520. The pressure sensors 525A-B may be used to control the fluid control valve 512 and fluid pump 522.

Figure 6:
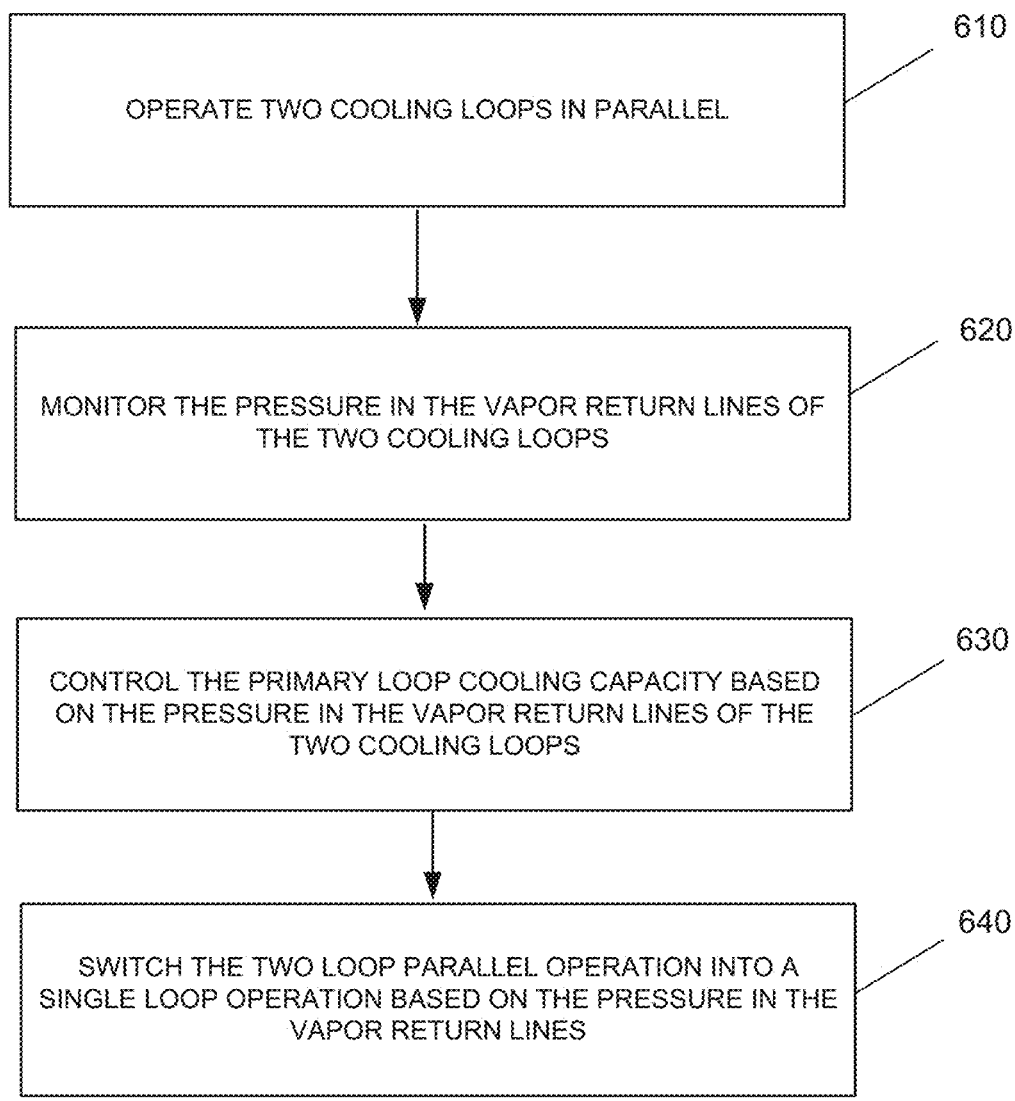
FIG. 6 shows a flow diagram of an example method of operating parallel cooling loops based on vapor return line pressure, according to another embodiment.

FIG. 6 illustrates a flow diagram of a method 600 of operating parallel cooling loops based on vapor return line pressure. At block 610, two cooling loops are deployed and operated in parallel. At block 620, the pressure in the vapor return line of each of the two cooling loops are monitored. At block 630, the primary loop cooling capacity is controlled based on the pressure in the vapor return lines of the two cooling loops. Optionally, at block 640, the two loop parallel operation switched to a single loop operation based on the pressure in the vapor return lines.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An immersion cooling system, comprising:
   an immersion tank to contain one or more electronic devices that are at least partially submerged in a dielectric coolant contained therein;
   a first cooling loop coupled to the immersion tank to provide cooling liquid to the immersion tank, wherein the first cooling loop comprises a first condenser unit, a first liquid supply line, and a first vapor return line;
   a second cooling loop coupled to the immersion tank to provide cooling liquid to the immersion tank, wherein the second cooling loop comprises a second condenser unit, a second liquid supply line, and a second vapor return line;
   a first pressure sensor coupled to the first vapor return line;
   a second pressure sensor coupled to the second vapor return line; and
   at least one main cooling source comprising a fluid control valve controlled based on the first pressure sensor and the second pressure sensor, wherein the at least one main cooling source comprises a first main cooling source coupled to the first condenser unit comprising a first fluid control valve that is controlled at least in part by the second pressure sensor.

2. The immersion cooling system of claim 1, wherein the at least one main cooling source comprises:
   a second main cooling source coupled to the second condenser unit.

3. The immersion cooling system of claim 2, wherein the second main cooling source comprises a second fluid control valve.

4. The immersion cooling system of claim 3, wherein the second fluid control valve is controlled at least in part by the first pressure sensor.

5. The immersion cooling system of claim 2, wherein the first main cooling source comprises a two-way fluid control valve to the first condenser unit and to the second condenser unit.

6. The immersion cooling system of claim 1, wherein the at least one main cooling source comprises one main cooling source comprising a splitter fluid control valve to the first condenser unit and the second condenser unit.

7. The immersion cooling system of claim 1, wherein the first condenser unit, the second condenser unit and the fluid control valve are included within a two-phase distribution unit.

8. The immersion cooling system of claim 7, wherein the first pressure sensor and the second pressure sensor are disposed within the two-phase distribution unit.

9. The immersion cooling system of claim 1, further comprising a management controller to:
   receive pressure data from the first pressure sensor and the second pressure sensor; and
   control the fluid control valve based on the pressure data from the first pressure sensor and the second pressure sensor.

10. An immersion cooling system, comprising:
    an immersion tank to contain one or more servers that are at least partially submerged in a dielectric coolant contained therein;
    a two phase distribution unit comprising:
       a first liquid condenser coupled to the immersion cooling tank to provide liquid coolant to the immersion cooling system via a first liquid supply line and receive vapor from the immersion cooling system via a first vapor return line, and
       a second liquid condenser coupled to the immersion cooling tank to provide liquid coolant to the immersion cooling system via a second liquid supply line and receive vapor from the immersion cooling system via a second vapor return line;
    a first pressure sensor coupled to the first vapor return line to measure pressure of the vapor in the first vapor return line;
    a second pressure sensor coupled to the second vapor return line to measure pressure of the vapor in the second vapor return line; and
    one or more main cooling sources coupled to the two phase distribution unit, including a first main cooling source coupled to the first liquid condenser; and
    one or more fluid control valves disposed on the one or more main cooling sources including a first fluid control valve disposed on the first main cooling source, wherein the one or more fluid control valves are controlled based on the first and second pressure sensors including the first fluid control valve being controlled at least in part by the second pressure sensor.

11. The immersion cooling system of claim 10, wherein the one or more main cooling sources further comprises:
    a second main cooling source coupled to the second liquid condenser.

12. The immersion cooling system of claim 11, wherein the second main cooling source comprises a second fluid control valve.

13. The immersion cooling system of claim 12, wherein second fluid control valve is controlled at least in part by the first pressure sensor.

14. The immersion cooling system of claim 11, wherein the first main cooling source comprises a two-way fluid control valve to the first liquid condenser and to the second liquid condenser.

15. The immersion cooling system of claim 10, wherein the one or more main cooling sources comprise one main cooling source comprising a splitter fluid control valve to the first liquid condenser and the second liquid condenser.

16. The immersion cooling system of claim 10, wherein the first liquid condenser, the second liquid condenser and the one or more fluid control valves are included within a two-phase distribution unit.

17. The immersion cooling system of claim 16, wherein the first pressure sensor and the second pressure sensor are disposed within the two-phase distribution unit.

18. A method of controlling a two-phase cooling distribution unit, comprising:
    receiving pressure data from a first pressure sensor coupled to a first vapor return line of a first coolant distribution loop;

receiving pressure data from a second pressure sensor coupled to a second vapor return line of a second coolant distribution loop, wherein the second coolant distribution loop operates in parallel with the first coolant distribution loop; and controlling a cooling capacity of the first coolant distribution loop based on the pressure data from the first pressure sensor and the second pressure sensor, wherein the two-phase cooling distribution unit comprises an immersion tank to contain one or more electronic devices that are at least partially submerged in a dielectric coolant contained therein;

the first cooling distribution loop coupled to the immersion tank to provide cooling liquid to the immersion tank, wherein the first cooling distribution loop comprises a first condenser unit, a first liquid supply line, and the first vapor return line;

the second cooling distribution loop coupled to the immersion tank to provide cooling liquid to the immersion tank, wherein the second cooling distribution loop comprises a second condenser unit, a second liquid supply line, and a second vapor return line;

the first pressure sensor coupled to the first vapor return line;

the second pressure sensor coupled to the second vapor return line; and at least one main cooling source comprising a fluid control valve controlled based on the first pressure sensor and the second pressure sensor, wherein the at least one main cooling source comprises a first main cooling source coupled to the first condenser unit comprising a first fluid control valve that is controlled at least in part by the second pressure sensor.

19. The method of claim 18, wherein controlling the cooling capacity of the first coolant distribution loop comprises switching from parallel operation of the first and second coolant distribution loops to a single loop operation of either the first coolant distribution loop or the second coolant distribution loop based on the pressure data from the first pressure sensor and the second pressure sensor.

20. The method of claim 18, wherein the pressure data indicates a maximum cooling capacity to be provided to a single condenser of the first or second coolant distribution loop.

* * * * *